United States Patent
Ronde et al.

(10) Patent No.: US 11,131,937 B2
(45) Date of Patent: Sep. 28, 2021

(54) POSITIONING DEVICE, STIFFNESS REDUCTION DEVICE AND ELECTRON BEAM APPARATUS

(71) Applicant: ASML Netherlands B.V., Veldhoven (NL)

(72) Inventors: Michaël Johannes Christiaan Ronde, Berghem (NL); Johannes Hubertus Antonius Van De Rijdt, Gemert (NL); Maarten Frans Janus Kremers, Eindhoven (NL); Erik Maria Rekkers, Boxtel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/723,995

(22) Filed: Dec. 20, 2019

(65) Prior Publication Data
US 2020/0201196 A1   Jun. 25, 2020

(30) Foreign Application Priority Data

Dec. 21, 2018   (EP) ..................................... 18215161

(51) Int. Cl.
*G03B 27/42* (2006.01)
*G03F 7/20* (2006.01)
*H01L 21/67* (2006.01)

(52) U.S. Cl.
CPC .......... *G03F 7/70766* (2013.01); *G03F 7/709* (2013.01); *G03F 7/70716* (2013.01); *G03F 7/70775* (2013.01); *H01L 21/67259* (2013.01)

(58) Field of Classification Search
CPC ............. G03F 7/70716; G03F 7/70766; G03F 7/70775; G03F 7/709; F16F 7/1005; H01J 37/3174; H01L 21/67259; H02N 15/00
See application file for complete search history.

(56) References Cited

U.S. PATENT DOCUMENTS

| | | | | |
|---|---|---|---|---|
| 6,304,320 | B1* | 10/2001 | Tanaka | G03F 7/70716 355/73 |
| 6,987,558 | B2* | 1/2006 | Yuan | F16F 7/1005 355/53 |
| 2004/0160585 | A1* | 8/2004 | Jacobs | G03F 7/709 355/53 |

FOREIGN PATENT DOCUMENTS

| | | |
|---|---|---|
| CN | 104698766 B | 1/2017 |
| CN | 104981891 B | 7/2017 |

(Continued)

OTHER PUBLICATIONS

Office Action and Search Report mailed by Chinese Patent Office, corresponding Taiwan Application No. 108146341, dated Aug. 20, 2020. (7 pages).

*Primary Examiner* — Peter B Kim
(74) *Attorney, Agent, or Firm* — Finnegan, Henderson, Farabow, Garrett & Dunner, LLP

(57) ABSTRACT

A positioning device configured to displace an object is disclosed. The positioning device comprises a stage to support the object, an actuator to move the stage with respect to a reference in a direction of movement, a balance mass arranged between the actuator and the reference to reduce transfer of reaction forces from the actuator to the reference, a support device arranged between the reference and the balance mass to support the balance mass, and a gravity compensator acting between the reference and the balance mass to exert a lifting force on the balance mass to reduce a gravitational support force to be provided by the support device to support the balance mass.

19 Claims, 9 Drawing Sheets

(56) References Cited

FOREIGN PATENT DOCUMENTS

| | | | |
|---|---|---|---|
| TW | 201643552 A | 12/2016 | |
| TW | 201839520 A | 11/2018 | |
| WO | WO 2013/004278 A1 | 1/2013 | |
| WO | WO 2014/012729 A1 | 1/2014 | |
| WO | WO-2017089214 A1 * | 6/2017 | ......... G03F 7/70758 |

* cited by examiner

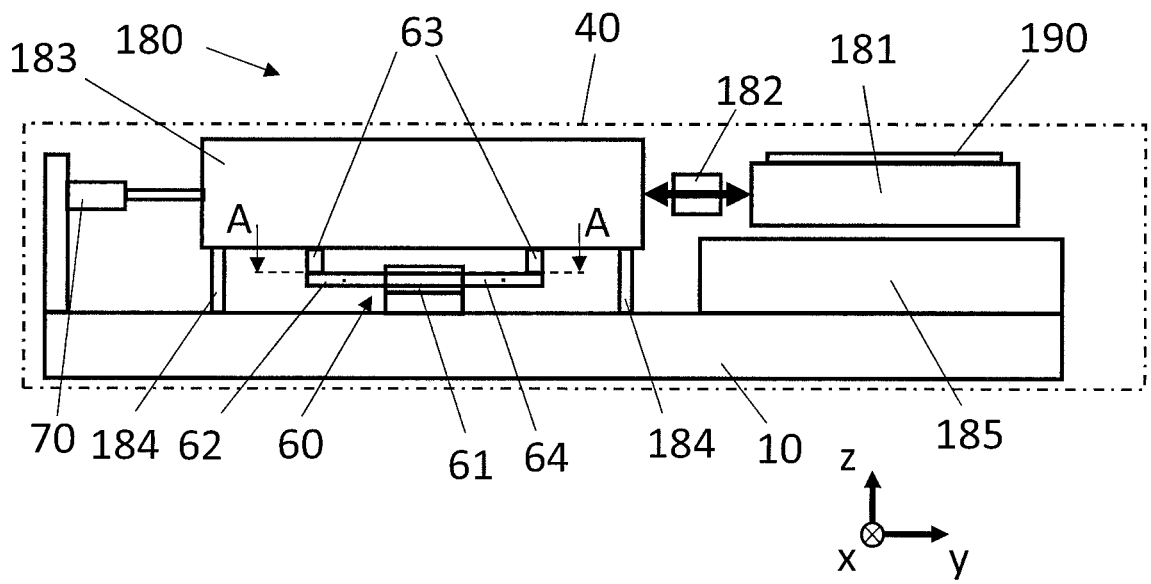
FIG. 8
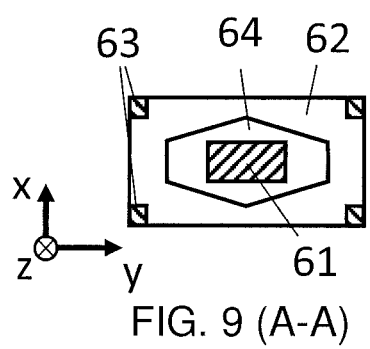
FIG. 9 (A-A)
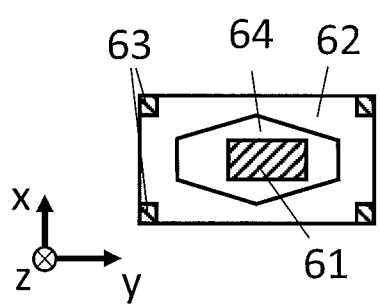
FIG. 10 (A-A)
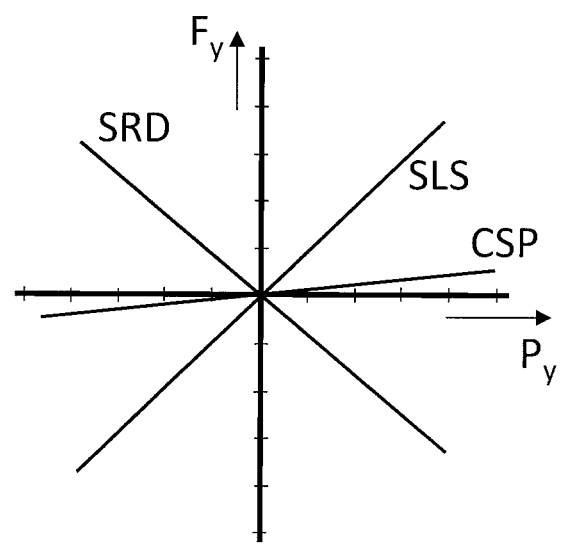
FIG. 11

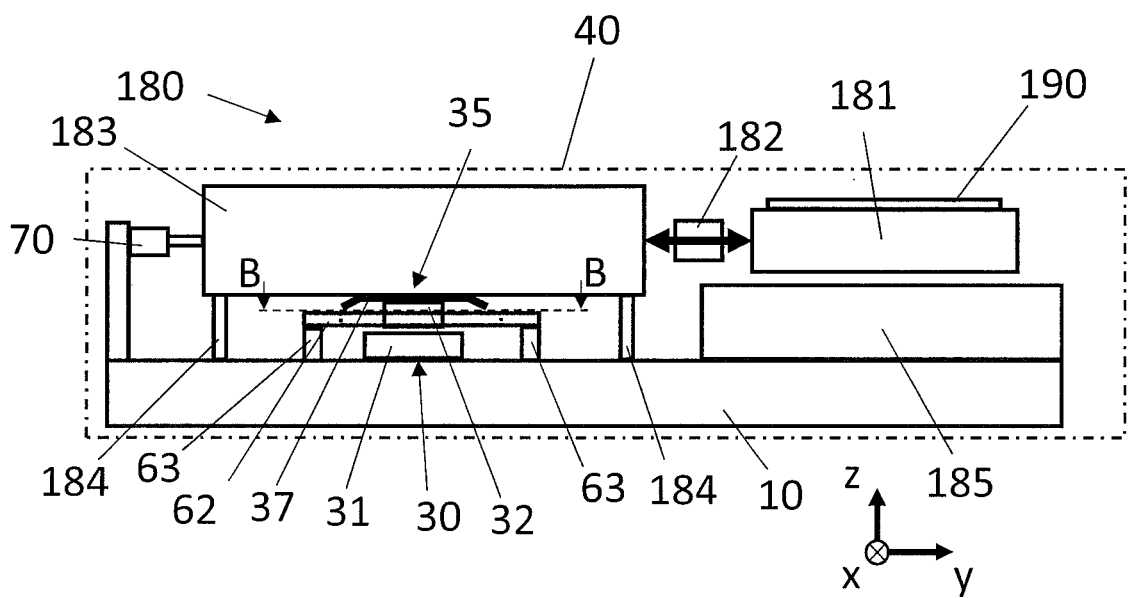
FIG. 12
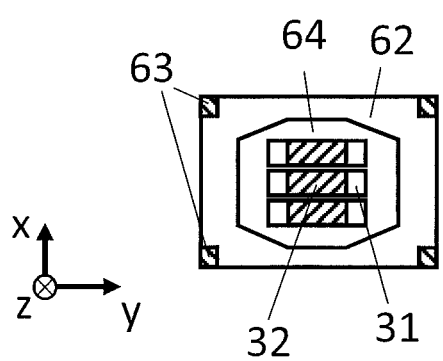
FIG. 13 (B-B)

POSITIONING DEVICE, STIFFNESS REDUCTION DEVICE AND ELECTRON BEAM APPARATUS

RELATED APPLICATIONS

The present application claims priority to European Application No. 18215161.3, filed on Dec. 21, 2018, which is hereby incorporated by reference in its entirety.

FIELD

The present disclosure relates to a positioning device, a stiffness reduction device, and an electron beam (e-beam) apparatus.

BACKGROUND ART

A positioning device may be used to position an object, e.g. a substrate, inside a processing tool, e.g. an e-beam inspection tool. In an embodiment, the positioning device comprises a movable stage to support the object. An actuator may be provided to move the stage, and the object supported thereon e.g. with respect to a reference in a horizontal direction of movement. A balance mass may be arranged between the reference and the actuator. Such balance mass may be provided to reduce the transfer of reaction forces from the actuator to the reference. The balance mass may be supported on the reference with a support device which is arranged between the balance mass and the reference.

The balance mass typically moves in a direction of movement opposite to the movement of the stage. This means that when the stage moves for example in positive direction along a horizontal direction, the balance mass will move in the negative direction of the same horizontal direction. Further, the balance mass has typically a weight which is substantially higher than the weight of the stage, for example a weight ratio of 5:1 may be applied. As a result of this difference in weight, there will be an opposite ratio between displacements of the balance mass and the stage in the direction of movement resulting in less displacement of the balance mass compared to the stage while still reducing the transfer of reaction forces to the reference. For example, the weight ratio of 5:1 between balance mass and stage will result in a displacement ratio of 1:5 in the direction of movement.

A support device to support the balance mass may comprise multiple leaf springs arranged between the reference and the balance mass. During normal operation of the balance mass, the leaf springs provide sufficient stiffness in the vertical direction to support the balance mass in vertical direction to overcome gravity forces. The leaf springs are further designed to have a relatively low stiffness in a horizontal direction of movement of the stage to reduce a disturbance effect of the leaf springs in direction of movement of the balance mass caused by the stiffness of the leaf springs. However, in practice, this relatively low stiffness in the direction of movement may still have a stiffness value that has a negative effect on the performance of the positioning device.

Furthermore, the achievable stroke of the leaf springs may be limited due to stress and fatigue of the material of the leaf springs that occurs during normal operation of the positioning device. Although this stress and fatigue may be reduced by reduction of the weight of the balance mass, this reduction of weight of the balance mass will result in a larger stroke being required for the balance mass in order to follow movements of the stage. The larger stroke may in itself also lead to higher stresses and potential fatigue issues.

SUMMARY

Some embodiments of the present disclosure provide a positioning device having a balance mass with reduced effective stiffness in the direction of movement of the stage of the positioning device.

In some embodiments, a positioning device configured to displace an object is provided. The positioning device comprises:
  a stage to support the object,
  an actuator to move the stage with respect to a reference in a direction of movement,
  a balance mass arranged between the actuator and the reference to reduce transfer of reaction forces from the actuator to the reference,
  a support device arranged between the reference and the balance mass to support the balance mass, and
  a gravity compensator acting between the reference and the balance mass to exert a lifting force on the balance mass to reduce a gravitational support force to be provided by the support device to support the balance mass.

According to some embodiments of the present disclosure, a positioning device configured to displace an object is provided. The positioning device comprises:
  a stage to support the object,
  an actuator to move the stage with respect to a reference in a direction of movement,
  a balance mass arranged between the actuator and the reference to reduce transfer of reaction forces from the actuator to the reference,
  a support device arranged between the reference and the balance mass, the support device having a first stiffness in the direction of movement, and
  a stiffness reduction device acting between the reference and the balance mass, the stiffness reduction device providing a second stiffness in the direction of movement, wherein the second stiffness is a negative stiffness that counteracts the first stiffness at least partly.

Some other embodiments of the present disclosure provide a stiffness reduction device to reduce a first stiffness of a support device arranged between a balance mass and a reference to allow movement between the balance mass and the reference in a direction of movement, wherein the stiffness reduction device provides a second stiffness in the direction of movement, wherein the second stiffness is a negative stiffness that counteracts the first stiffness at least partly.

In some embodiments of the present disclosure, an E-beam apparatus is provided. The E-beam apparatus comprises:
  the positioning device as defined in any of the clauses 1-32, wherein the positioning device is configured to displace the object relative to the e-beam generated by the electron optics system.

In some embodiments of the present disclosure, an apparatus is provided. The apparatus comprises vacuum chamber and the positioning device as defined in any of the clauses 1-32, wherein the positioning device is arranged in the vacuum chamber.

BRIEF DESCRIPTION OF THE DRAWINGS

The present disclosure will be readily understood by the following detailed description in conjunction with the accompanying drawings, wherein like reference numerals designate like structural elements, and in which:

FIG. 8 schematically depicts a third example of a positioning device according to some embodiments of the present disclosure;

FIG. 9 schematically depicts a top view of a cross section of a stiffness reduction device of the positioning device of FIG. 8;

FIG. 10 schematically depicts a top view of a cross section of a stiffness reduction device of the positioning device of FIG. 8;

FIG. 11 schematically depicts stiffness profiles of the leaf springs and stiffness reduction device of the third example of FIG. 8;

FIG. 12 schematically depicts a fourth example of a positioning device according to some embodiments of the present disclosure;

FIG. 13 schematically depicts a top view of the stiffness reduction device and magnetic gravity compensator of the positioning device of FIG. 12;

Figures 1A, 1B:
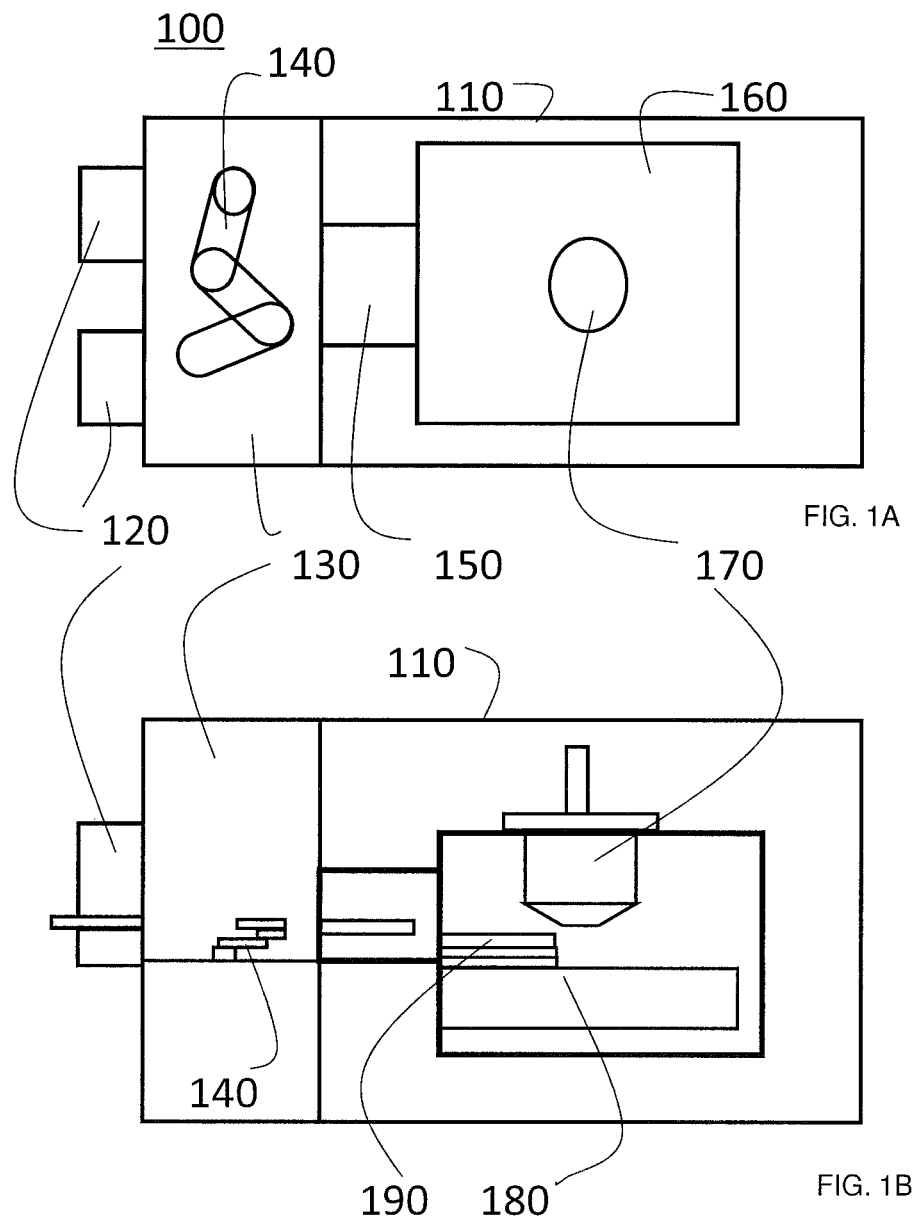
FIGS. 1A and 1B are schematic illustrations of an e-beam inspection tool, consistent with embodiments of the present disclosure.

While the present disclosure is susceptible to various modifications and alternative forms, specific embodiments thereof are shown by way of example in the drawings and may berein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Various example embodiments of the present disclosure will now be described more fully with reference to the accompanying drawings in which some example embodiments of the present disclosure are shown. Specific structural and functional details disclosed herein are merely representative for purposes of describing example embodiments of the present disclosure. These embodiments, however, may be embodied in many alternate forms and should not be construed as limited to only the disclosed embodiments set forth herein.

Accordingly, while example embodiments of the disclosure are capable of various modifications and alternative forms, embodiments thereof are shown by way of example in the drawings and will herein be described in detail. It should be understood, however, that there is no intent to limit example embodiments of the disclosure to the particular forms disclosed, but on the contrary, example embodiments of the disclosure are to cover all modifications, equivalents, and alternatives falling within the scope of the disclosure. Like numbers refer to like elements throughout the description of the figures.

As used herein, the term "specimen" generally refers to a wafer or any other specimen on which defects of interest (DOI) may be located. Although the terms "specimen" and "sample" are used interchangeably herein, it is to be understood that embodiments described herein with respect to a wafer may be configured and/or used for any other specimen (e.g., a reticle, mask, or photomask).

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

In this disclosure, "axial" means "in the optical axis direction of an apparatus, column or a device such as a lens", while "radial" means "in a direction perpendicular to the optical axis". Usually, the optical axis starts from the cathode and ends at specimen. The optical axis always refers to z-axis in all drawings.

The term, crossover, refers to a point where the electron beam is focused.

The term, virtual source, means the electron beam emitted from the cathode can be traced back to a "virtual" source.

The inspection tool according to the present disclosure relates to a charged particle source, especially to an e-beam source which can be applied to a SEM, an e-beam inspection tool, or an E-Beam Direct Writer (further also referred to as EBDW). The e-beam source, in this art, may also be referred to as an e-gun or Electron Gun.

With respect to the drawings, it is noted that the figures are not drawn to scale. In particular, the scale of some of the elements of the figures may be greatly exaggerated to emphasize characteristics of the elements. For example, a thicknesses of layers and regions may be exaggerated for clarity. It is also noted that the figures are not drawn to the same scale. Elements shown in more than one figure that may be similarly configured have been indicated using the same reference numerals.

In the drawings, relative dimensions of each component and among every component may be exaggerated for clarity. Within the following description of the drawings the same or like reference numbers refer to the same or like components or entities, and only the differences with respect to the individual embodiments are described.

FIGS. 1A and 1B schematically depict a top view and a cross-sectional view of an electron beam (e-beam) inspection (further also referred to as EBI) system 100 according to some embodiments of the present disclosure. The example as shown comprises an enclosure 110, a pair of load ports 120 serving as an interface to receive objects to be examined and to output objects that have been examined. The example as shown further comprises an object transfer system indicated as equipment front end module 130 (further also referred to as EFEM), that is configured to handle and/or transport the objects to and from the load ports. In the example as shown, the EFEM 130 comprises a handler robot 140 configured to transport objects between the load ports and a load lock 150 of the EBI system 100. The load lock 150 is an interface between atmospheric conditions occurring outside the enclosure 110 and in the EFEM and the vacuum conditions occurring in a vacuum chamber 160 of the EBI system 100. In the example as shown, the vacuum chamber 160 comprises an electron optics system 170 configured to project an e-beam onto an object to be inspected, e.g. a semiconductor substrate or wafer. The EBI system 100 further comprises a positioning device 180 that is configured to displace the object 190 relative to the e-beam generated by the electron optics system 170.

In some embodiments, the positioning device may comprise a cascaded arrangement of multiple positioners such an XY-stage for positioning the object during normal operation in a substantially horizontal plane, and a Z-stage for positioning the object during normal operation in the vertical direction.

In some embodiments, the positioning device may comprise a combination of a coarse positioner, configured to provide a coarse positioning of the object over comparatively large distances and a fine positioner, configured to provide a fine positioning of the object over comparatively small distances.

In some embodiments, the positioning device 180 further comprises an object table for holding the object during the inspection process performed by the EBI system 100. In such embodiments, the object 190 may be clamped onto the object table by means of a clamp such as an electrostatic clamp. Such a clamp may be integrated in the object table.

In accordance with the present disclosure, the positioning device 180 comprises a first positioner for positioning the object table and a second positioner for positioning the first positioner and the object table.

Figure 2:
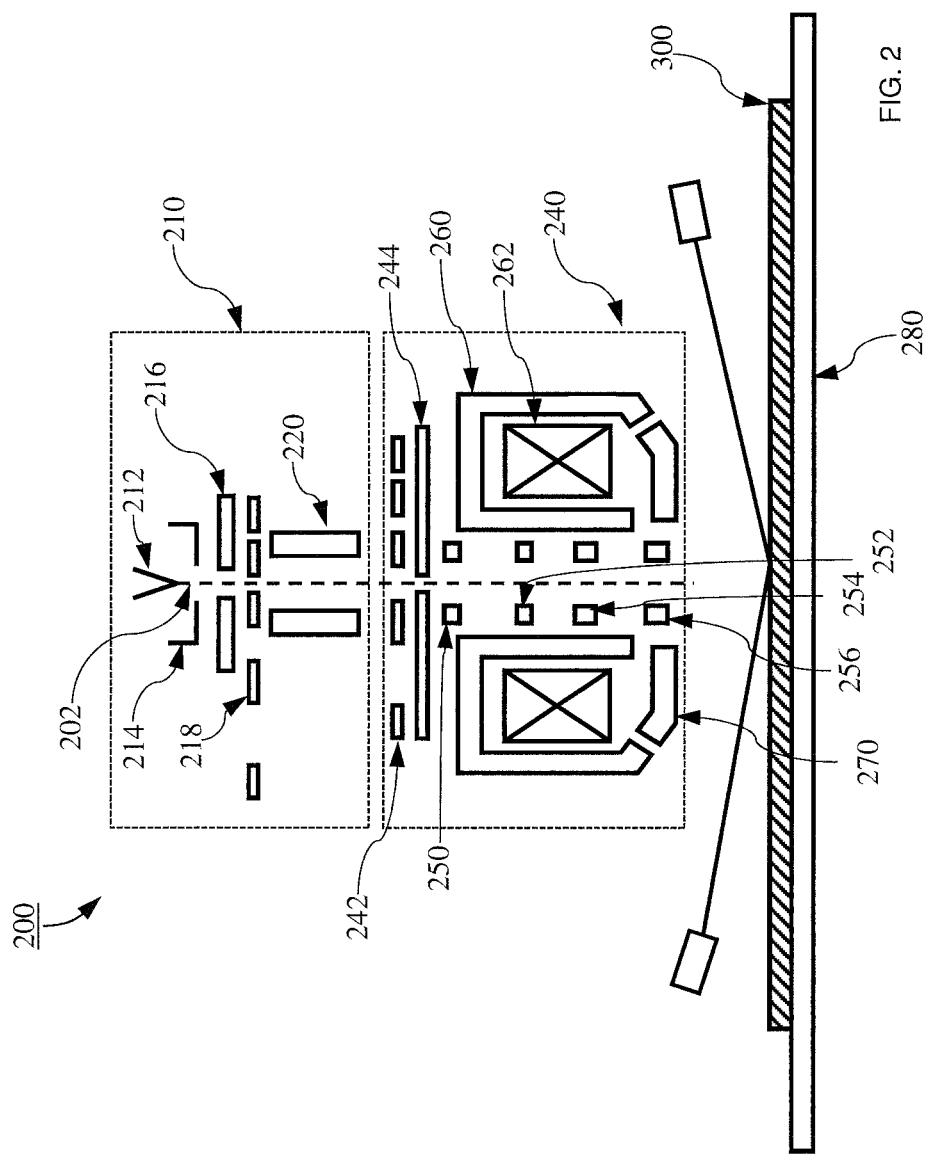
FIGS. 2 and 3 are schematic illustrations an electron optical system as can be applied in some embodiments of the present disclosure.

FIG. 2 schematically depicts an example of an electron optics system 200 as can be applied in e-beam inspection tool or system according to some embodiments of the present disclosure. The electron optics system 200 comprises an e-beam source, also referred to as the electron gun 210 and an imaging system 240.

The electron gun 210 comprises an electron source 212, suppressor 214, an anode 216, a set of apertures 218, and a condenser 220. The electron source 212 may, for example, be a Schottky emitter. More specifically, the electron source 212 includes a ceramic substrate, two electrodes, a tungsten filament, and a tungsten pin. The two electrodes are fixed in parallel to the ceramic substrate, and the other sides of the two electrodes are respectively connected to two ends of the tungsten filament. The tungsten is slightly bended to form a tip for placing the tungsten pin. Next, a ZrO2 is coated on the surface of the tungsten pin and is heated to 1300° C. so as to be melted and cover the tungsten pin but uncover the pinpoint of the tungsten pin. The melted ZrO2 reduces the work function of the tungsten and decreases the energy barrier of the emitted electron, and thus enabling a more efficient emission of the electron beam 202. Then, by applying negative voltage to the suppressor 214, the electron beam 202 is suppressed. Accordingly, the electron beam having the large spread angle is suppressed to the primary electron beam 202, and thus the brightness of the electron beam 202 is enhanced. By the positive charge of the anode 216, the electron beam 202 can be extracted, and then the Coulomb's compulsive force of the electron beam 202 may be controlled by using the tunable aperture 218 which has different aperture sizes for eliminating the unnecessary electron beam outside of the aperture. In order to condense the electron beam 202, the condenser 220 is applied to the electron beam 202, which also provides magnification. The condenser 220 shown in FIG. 2 may e.g. be an electrostatic lens which can condense the electron beam 202. On the other hand, the condenser 220 can be also a magnetic lens.

Figure 3:
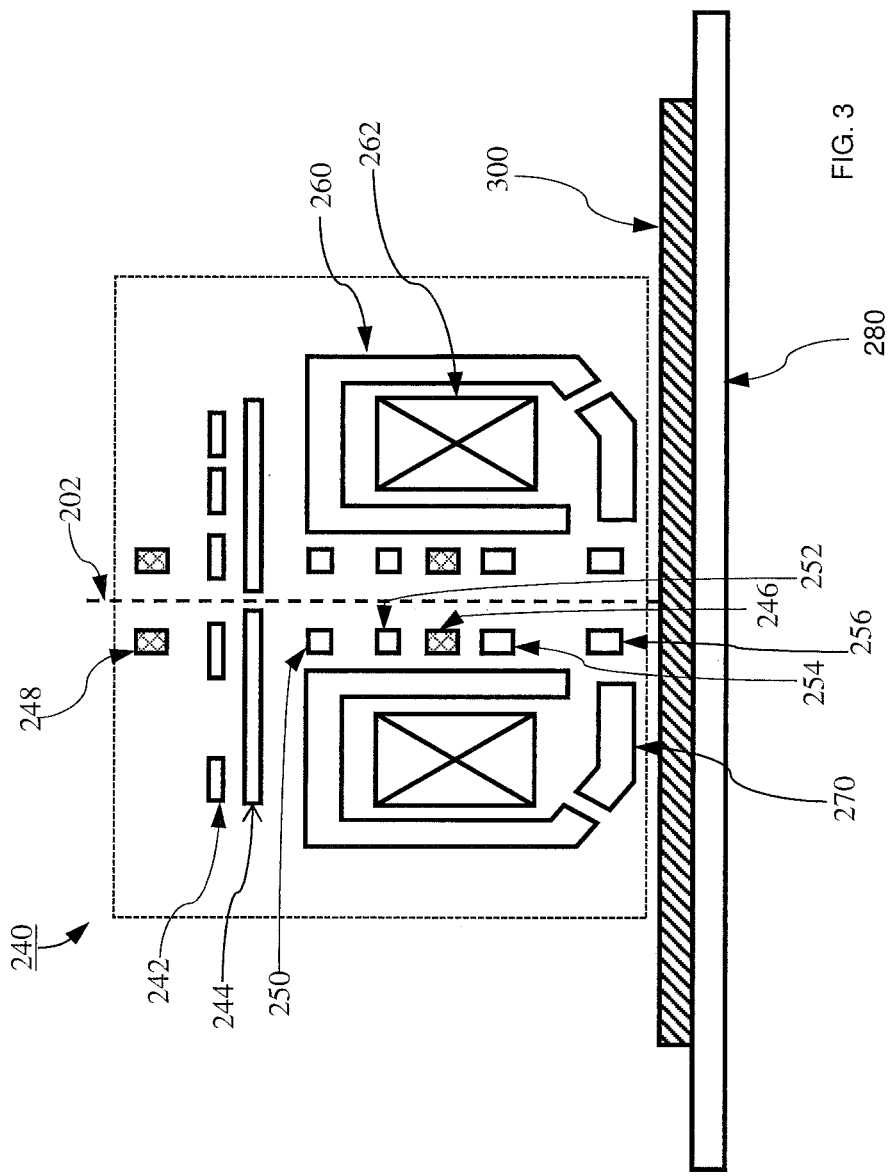

The imaging system 240 as shown in FIG. 3 comprises a blanker 248, a set of apertures 242, a detector 244, four sets of deflectors 250, 252, 254, and 256, a pair of coils 262, a yoke 260, a filter 246, and an electrode 270. The electrode 270 is used to retard and deflect the electron beam 202, and further has electrostatic lens function due to the combination of upper pole piece and sample 300. Besides, the coil 262 and the yoke 260 constitute the magnetic objective lens.

To create a relatively stable electron beam 202, the electron source typically is heated during a relatively long time period. To avoid electrons to hit any sample during this stabilization period, the blanker 248 is applied to the electron beam 202 for temporally deflecting the electron beam 202 away from the sample.

The deflectors 250 and 256 are applied to scan the electron beam 202 to obtain a relatively large field of view, and the deflectors 252 and 254 are used for scanning the electron beam 202 to obtain a relatively small field of view. All the deflectors 250, 252, 254, and 256 may control the scanning direction of the electron beam 202. The deflectors 250, 252, 254, and 256 may be electrostatic deflectors or magnetic deflectors. During normal operation, the opening of the yoke 260 is faced towards the sample 300, which immerses the magnetic field into the sample 300.

Due to the illumination of the sample 300 with the electro beam 202, secondary electrons emerge from the surface of the sample 300 which may be directed to the detector 244 by the filter 246.

Figure 4:
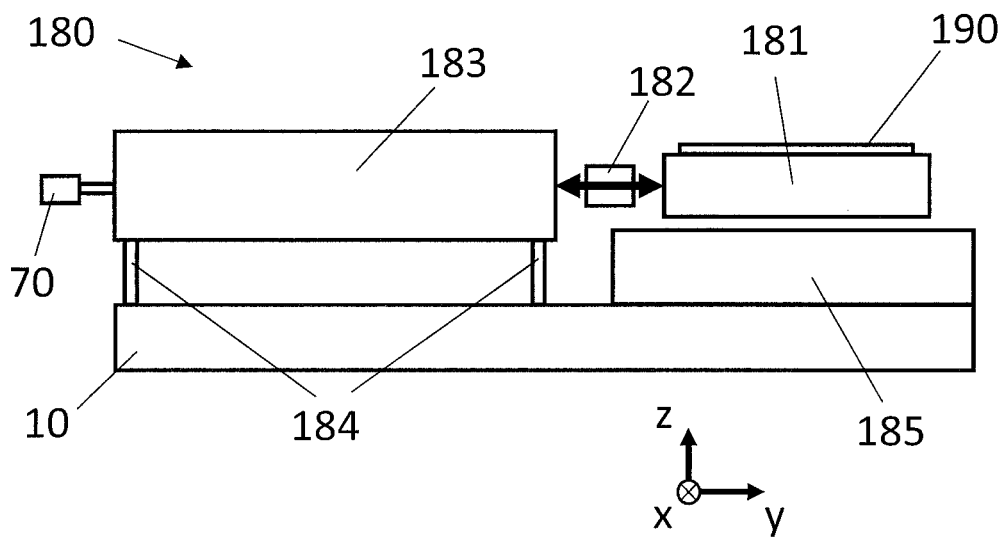
FIG. 4 schematically depicts an example of a known positioning device.

FIG. 4 schematically depicts an example of a positioning device 180. This positioning device 180 comprises a stage 181 arranged to support an object 190, for example a substrate or wafer. Actuators 182 are provided to move the stage 181, and therewith the object 190, with respect to a reference 10 in a horizontal direction of movement y.

The stage 181 is supported by a linear or planar bearing 185, for example a magnetic hearing with permanent magnet or electromagnets, an air bearing or a roller bearing. The planar bearing 185 supports the stage 181 in vertical direction (z-direction) without stiffness or with a relatively very low stiffness in the direction of movement y.

A balance mass 183 is arranged between the actuator 182 and the reference 10 to reduce transfer of reaction forces from the actuators 182 to the reference 10. The reference 10 is for example a frame, such as a base frame or a metrology frame of an e-beam inspection tool 100:

When the stage 181 is actuated by the actuators 182 to move the stage 181 in the positive y-direction (e.g. to the right in FIG. 4), the balance mass 183 will move, due to the reaction forces of the actuators 182, in the negative y-direction (e.g. to the left in FIG. 4). Typically, the weight of the balance mass 183 is substantially larger than the weight of the stage 181, for example with a weight ratio of 5:1. As a result of this difference in weight, the displacement of the balance mass 183 in the negative y-direction will be substantially smaller than the displacement of the stage 181 in the positive y-direction. For example, with a weight ratio of 5:1 between the weight of the balance mass 183 and the weight of the stage 181, the displacement ratio between displacement of the balance mass 183 and the displacement of the stage 181 will be 1:5.

The balance mass 183 is supported by a support system comprising multiple leaf springs 184 between the reference 10 and the balance mass 183. The multiple leaf springs 184 are elastic guiding devices constructed to support the balance mass 183 in vertical z-direction, i.e. the multiple leaf springs 184 provide a gravitational support force to counteract a gravity force exerted on the balance mass 183. To provide the lifting force during normal operation in the vertical z-direction, the leaf springs 184 have a suitable stiffness in the vertical direction.

To accommodate movement of the balance mass 183 in the direction of movement y, the leaf springs 184 may allow a displacement of the balance mass 183 in the direction of movement y. The leaf springs 184 are further designed to have a relatively low stiffness in the direction of movement y of the balance mass 183. This relatively low stiffness of the leaf springs 184 in the horizontal direction of movement is provided to transfer minimal reaction forces of the actuator 182 in the direction of movement to the frame 10. However, to carry the weight of the balance mass 183, the leaf springs 184 can have some stiffness in the direction of movement y in order to stably support the balance mass 183.

The stiffness in y-direction multiplied by the displacement in the direction of movement y results in a static disturbance force on the balance mass 183. A balance mass actuator 70 may be provided to keep, when required, the balance mass 183 in a position within the range of movement, in particular to prevent that the balance mass 183 returns to the central position as a result of this static disturbance force of the leaf springs 184. The balance mass actuator 70 is typically an actuator with no or very low stiffness in the direction of movement y of the balance mass 183, for example a Lorentz actuator.

The stiffness in y-direction of the leaf springs 184 may be lowered when the weight of the balance mass 183 is reduced. However, such reduced weight of the balance mass 183 may require larger displacements in reaction to displacements of the stage 181. Thereby, the larger stroke may also lead to higher stresses and potential fatigue in the leaf springs 184.

In view of the above, there is a desire to reduce the effective stiffness of the support device of the balance mass 183 in the direction of movement of the balance mass 183, without the requirement of reducing the weight of the balance mass 183.

Figure 5:
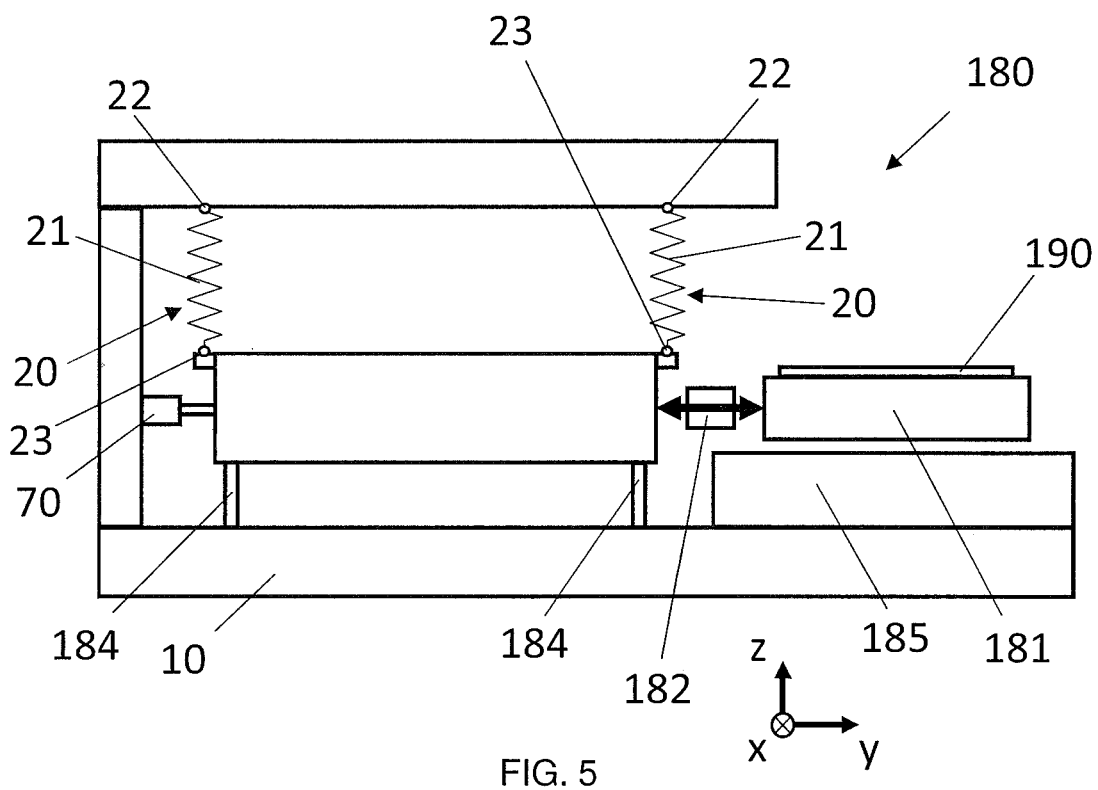
FIG. 5 schematically depicts a first example of a positioning device according to some embodiments the present disclosure.

FIG. 5 shows a first example of a positioning device 180 according to some embodiments of the present disclosure. In the positioning device 180 of FIG. 5, two gravity compensators 20 are provided. The gravity compensators 20 are configured to reduce the weight of the balance mass 183 that can be supported by the leaf springs 184. The gravity compensators 20 of the positioning device 180 of FIG. 5 are mechanical gravity compensators 20 comprising springs 21 arranged between the reference 10 and the balance mass 183. The springs 21 extend in vertical direction. An upper end of each of the springs 21 is connected at hinge 22 to the reference 10, in particular, a part of the reference 10 which is positioned at a higher level than the balance mass 183. A lower end of each of the springs 21 is connected at hinge 23 to the balance mass 183. The springs 21 are pre-tensioned to pull the balance mass 183 in vertical upwards direction, i.e. in a positive z direction. Due to the pulling force in upwards vertical direction exerted by the springs 21, a lifting force is exerted on the balance mass with the result that the weight of the balance mass 183 that can be carried by the leaf springs 184 is substantially reduced, while maintaining the overall mass of the balance mass 183.

As a result, the minimally required vertical stiffness of the leaf springs 184 to stably support the balance mass 183 is substantially lower than the vertical stiffness required in the example of FIG. 4, and as such the leaf springs 184 may be designed to provide a lower stiffness in vertical direction. Consequently, the stiffness of the leaf springs 184 in the direction of movement y of the balance mass 183 may also be lower. This lower stiffness of the leaf springs 184 in the direction of movement of the balance mass 183 provides more flexibility for movements of the balance mass 183 in reaction to actuation of the stage 181 and less transfer of reaction forces from the actuators 182 to the reference 10. Since the weight of the balance mass 183 may be the same as the example of FIG. 4, the maximum displacement to follow movement of the stage 181 does not have to be increased.

Due to the use of the hinges 22, 23, the horizontal stiffness of the springs 21 is reduced to substantially zero. The length of the springs 21 is also relatively large. The springs 21 therefore do not introduce, within the range of movement of the balance mass 183, any substantial horizontal stiffness.

The lifting force provided by the combination of the springs 21 may be substantially the same as the gravity force resulting from the weight of the balance mass 183, such that the weight of the balance mass 183 is mainly supported by the springs 21. The lifting force of the springs 21 does however not have to be exactly equal respect to the gravity force exerted on the balance mass 183, since the residue force, which is the difference between the gravity force exerted on the balance mass 183 and the lifting force provided by the springs 21, may be counteracted by the gravitational support force exerted by the leaf springs 184. This residue force may however be substantially lower than the gravity force exerted on the balance mass 183.

For example, when the lifting force provided by the combination of springs 21 is 90% to 110% of the gravity force exerted on the balance mass 183, only a maximum of 10% of the gravity force can be absorbed by the leaf springs 184. This force to be absorbed by the leaf springs 184 may be an upwards force, in case the springs 21 provide a lifting force smaller than 100% of the gravity force exerted on the balance mass 183, or a downwards force, in case the springs 21 provide a lifting force larger than 100% of the gravity force exerted on the balance mass 183.

In some embodiments, a maximum pushing/pulling force that can be provided by the multiple leaf springs 184 in combination is less than 0.5 times the gravity force exerted on the balance mass 183 due to the weight of the balance mass 183, for example in the range of 0.05 to 0.4 times the gravity force exerted on the balance mass 183 due to the weight of the balance mass 183, such as 0.08 to 0.2 times the gravity force exerted on the balance mass 183 due to the weight of the balance mass 183.

In some other embodiments, other types of mechanical gravity compensators may be used to provide a lifting force on the balance mass 183. For example, in the example of FIG. 5, springs 21 are provided that pull the balance mass 183 upwards to provide a lifting force on the balance mass 183. Alternatively, springs or other mechanical gravity compensators may be provided that push the balance mass 183 upwards to provide a lifting force on the balance mass 183.

Figure 6:
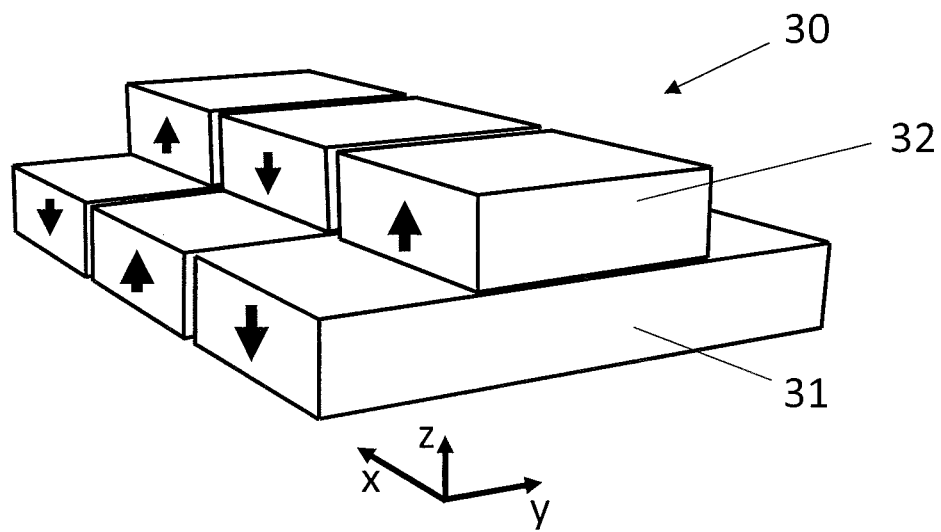
FIG. 6 schematically depicts a magnet assembly of an example of a magnetic gravity compensator according to some embodiments of the present disclosure.

FIG. 6 shows an example of a magnet assembly 30 that may be used as part of a magnetic gravity compensator. The magnet assembly 30 comprises three lower permanent magnets 31 arranged next to each other and three upper permanent magnets 32. Each upper permanent magnets 32 is arranged above one of the lower permanent magnets 31. Adjacent magnets of the lower permanent magnets 31 and the upper permanent magnets 32 have an opposite magnetization in the vertical direction, i.e. z-direction. The magnetization direction of the individual magnets 31, 32, in the magnet assembly 30 is indicated by arrows in the individual magnets 31, 32 in FIG. 6.

Figure 7A:
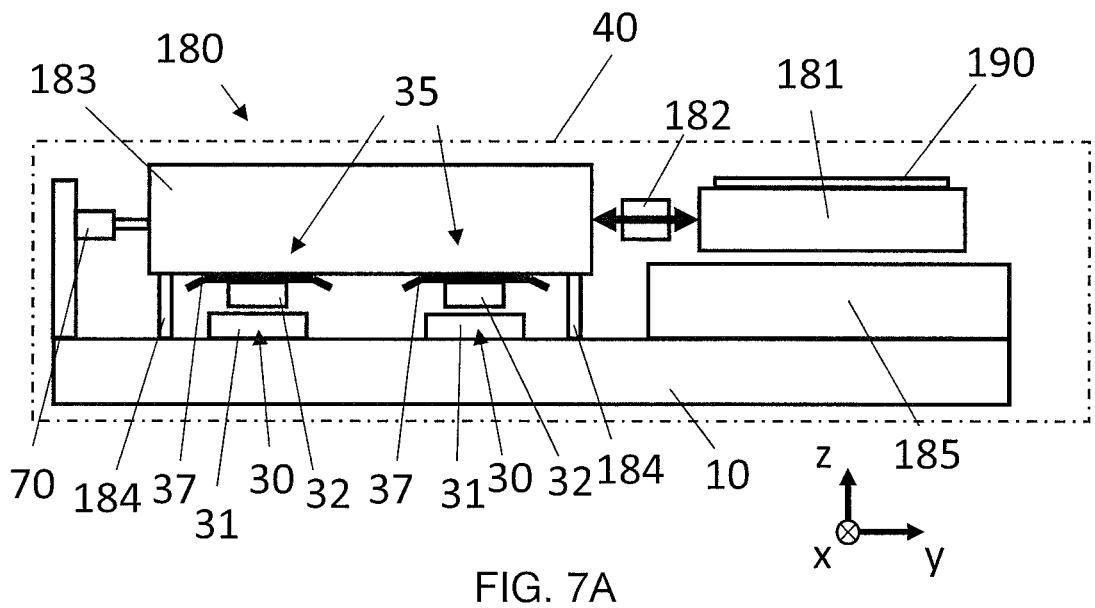
FIG. 7A schematically depicts a second example of a positioning device according to some embodiments of the present disclosure incorporating the magnetic gravity compensator of FIG. 6.

FIG. 7A shows two magnetic gravity compensators 35 for a positioning device 180, in which each of the magnetic gravity compensators 35 comprises a magnet assembly 30 as shown in FIG. 6. The magnetic gravity compensators 35 each comprises the lower permanent magnets 31 mounted on the reference 10 and the upper permanent magnets 32 mounted on the balance mass 183. Between the upper permanent magnets 32 and the balance mass 183 magnetic shields 37 are provided to shield the magnetic fields of the magnetic gravity compensator 35 from other magnetic fields in the positioning device 180, for instance magnetic fields of the actuators 182. The magnetic shields 37 may also be used to at least partially shield the magnetic fields of the magnetic gravity compensators 35 from other elements such as the electron beam 202 of the electron optics system 200 (see FIG. 2). When desired, further magnetic shields may be provided to shield the magnetic gravity compensators from other magnetic fields, and vice versa. The magnetic shields may be mounted on the stage 181, the balance mass 183, the reference 10 or any other suitable location.

Figure 7B:
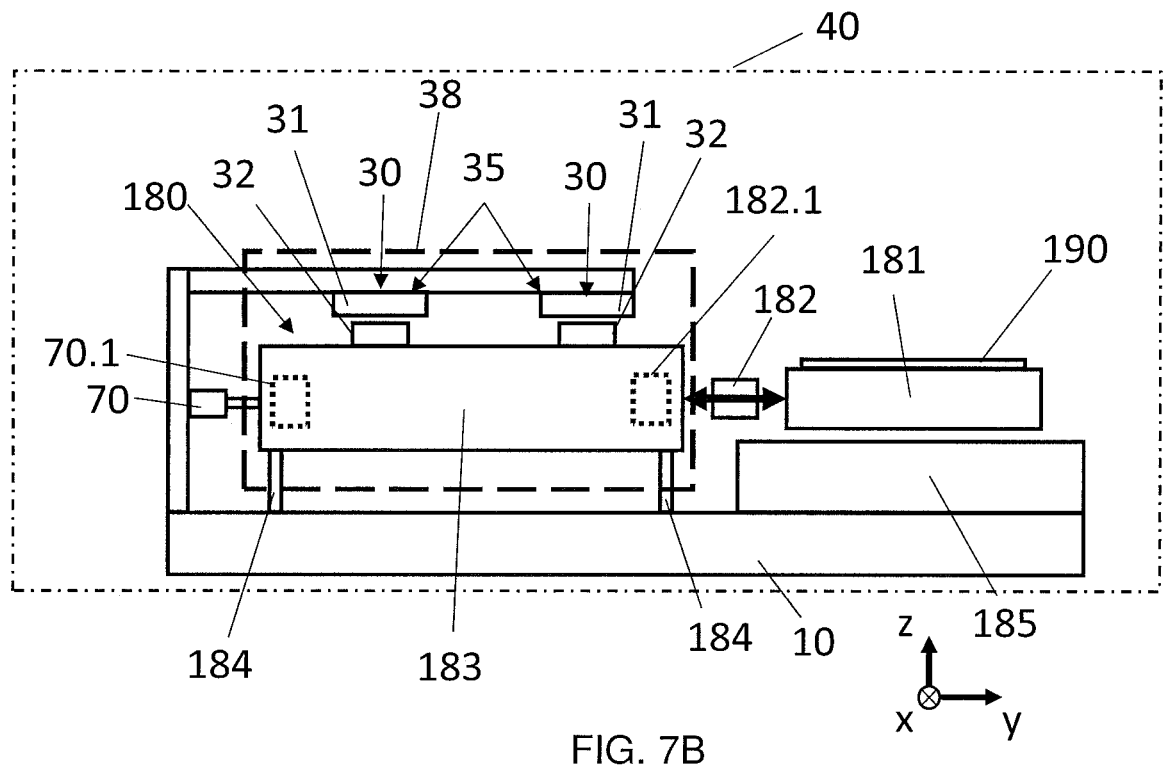
FIG. 7B schematically depicts a variation of the second example of a positioning device according to some embodiments of the present disclosure.

Even further magnetic shields may be provided to shield the magnetic fields produced by the gravity compensators and/or any magnetic components (e.g. the actuator 182, the balance mass actuator 70) to avoid or reduce leakages of the magnetic fields to the surrounding space, especially in regions that are sensitive to magnetic fields (e.g. regions above or around the object 190 where electron beams, which motion is sensitive to the magnetic fields, are irradiated; regions around the electron optics system 170; or regions between the electron optics system 170 and the object 190 where the electron beams move through). FIG. 7B shows an example of such even further magnetic shield 38. The even further magnetic shield 38 surrounds the permanent magnets 31,32 of the gravity compensators 35 and/or the permanent magnets 182.1, 70.1 of the actuator 182 and the balance mass actuator 70 that are arranged in/on the balance mass 183. The even further magnetic shield 38 may be equipped with slits and/or openings to allow movement of the balance mass 183 (e.g. slits or openings in the even further magnetic shield 38 may be arranged around the leaf spring 184 to allow the motion of the balance mass 183 and deformation of the leaf springs 184). The material of the even further magnetic shield 38 may be chosen such that the material has a high relative permeability at the magnetic flux density level within the even further magnetic shield 38 (i.e., the magnetic flux density level at the location of the even further magnetic shield 38). The even further magnetic shield 38 blocks more magnetic fields when the permeability of the even further magnetic shield is high. Different materials and/or compositions of a material may be used depending on the magnetic flux density level within the even further magnetic shield 38. In some embodiments, the material may be an Iron-Nickel alloy. It should be clear to the person skilled in the art that the same concept of providing such even further magnetic shields is applicable to other configurations such as the configuration in FIG. 7A where the gravity compensators 35 are arranged below the balance mass.

Figure 7C:
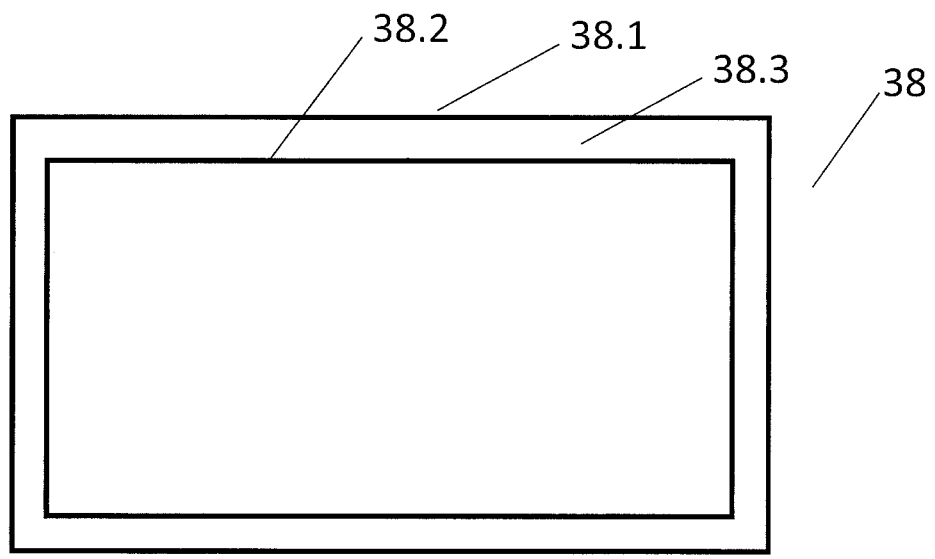
FIG. 7C schematically depicts an example of magnetic shields.

The even further magnetic shield 38 may comprise one or more magnetic shields. In some embodiments, the even further magnetic shield 38 comprises an inner magnetic shield 38.2 and an outer magnetic shield 38.1. The inner magnetic shield 38.2 surrounds the permanent magnets 31, 32 of the gravity compensators 35 and/or the permanent magnets 182.1, 70.1 of the actuator 182 and the balance mass actuator 70 that are arranged in/on the balance mass 183. The outer magnetic shield 38.1 surrounds the inner magnetic shield 38.2 with a gap 38.3 in between (FIG. 7C). Majority of the magnetic fields of permanent magnets 31, 32, 182.1, 70.1 are shielded by the inner magnetic shield 38.2 towards the outside of the inner magnetic shield 38.2. Due to the high resistivity of the gap 38.3 (e.g. vacuum in the embodiments of this document, or air in another potential embodiments), the leaked magnetic fields are then attracted towards the outer magnetic shield 38.1 and thus are shielded by the outer magnetic shield 38.1. The gap 38.3 may also be occupied by non-ferromagnetic materials, any material with a low relative permeability (e.g. lower than the permeabilities of the inner and the outer magnetic shields 38.1, 38.2), or any material with a relative permeability close to or substantially equal to 1. Different materials may be chosen for the inner and the outer magnetic shields 38.1, 38.2. The material for the inner or outer magnetic shields 38.1, 38.2 may be chosen such that the materials have high relative permeabilities at the magnetic flux density levels of the locations of the inner or outer magnetic shield 38.1, 38.2, respectively. The material for the inner magnetic shield 38.2 may be chosen a material that has a high relative permeability at the magnetic flux density level within the inner magnetic shield 38.2 (i.e., the magnetic flux density at the location of the inner magnetic shield 38.2). The material for the outer magnetic shield 38.1 may be chosen a different material than the material for the inner magnetic shield 38.2. The material for the outer magnetic shield 38.1 may be chosen a material that has a high relative permeability at the magnetic flux density level within the outer magnetic shield 38.1 (i.e., the magnetic flux density level at the location of the outer magnetic shield 38.1). The materials of the inner and the outer magnetic shields 38.1, 38.2 maybe the same alloy of different composition ratios, e.g. Iron-Nickel alloy with different composition ratios.

The magnet assemblies 30 are designed to exert a repelling force between the lower permanent magnets 31 and the upper permanent magnets 32 such that this repelling force acts as a lifting force on the balance mass 183 to counteract the gravity force exerted on the balance mass 183. In normal operation, the magnet assemblies 30 are designed to exert a lifting force on the balance mass 183 in vertical direction (z-direction), without exerting any substantial forces in the horizontal directions, including the direction of movement y of the balance mass 183. Therewith, the magnet assemblies 30 act as magnetic gravity compensators 35 that may provide a high (magnetic) stiffness in the vertical direction with substantially no stiffness in horizontal direction. Since a substantial part of the gravity force exerted on the balance mass 183 may be carried by the magnetic gravity compensators 35, the leaf springs 184 may be designed with a substantially lower vertical and horizontal stiffness.

For example, the lifting force provided by the combination of magnetic gravity compensators 35 may be 90% to 110% of the gravity force exerted on the balance mass 183. In such case only a maximum of 10% of the gravity force can be absorbed by the leaf springs 184. This force to be absorbed by the leaf springs 184 may be an upwards force, in case the combination of magnet assemblies 30 provides a lifting force smaller than 100% of the gravity force exerted on the balance mass 183, or a downwards force, in case the combination of magnet assemblies 30 provides a lifting force larger than 100% of the gravity force exerted on the balance mass 183.

In some embodiments, a maximum force that can be provided by the multiple leaf springs 184 in combination, may be less than 0.5 times the gravity force exerted on the balance mass 183, for example in the range of 0.05 to 0.4 times the gravity force exerted on the balance mass 183, such as 0.08 to 0.2 times the gravity force exerted on the balance mass 183.

An additional benefit of the lower horizontal stiffness of the multiple leaf springs 184 is that the actuation force that may be required by the balance mass actuator 70 to counteract the disturbance force resulting from an off-center position of the balance mass 183 may also be substantially lower. As a result, the heat dissipation of such balance mass actuator 70 may also be substantially lower.

Due to the use of the magnetic gravity compensators 35, it is possible to design a leaf spring that allows a relative large displacement with respect to its length; for example, a maximum allowable displacement from a central position of the balance mass 183 in the direction of movement y, may be at least 0.15 times the effective length of the leaf springs 184, for example 0.2 times the effective length of the leaf springs. The effective length of the leaf springs is, seen in the y-z plane the distance between a point of the leaf spring fixed with respect to the balance mass 183 and a point of the leaf spring fixed with respect to the reference 10.

As explained above, the balance mass of 183 is constructed to move, in reaction to a movement of the stage 181, in an opposite direction than the direction of movement of the stage 181, to prevent or at least reduce transfer of reaction forces from the actuators 182 to the reference 10. As a result of movement of the balance mass in the direction of movement, the upper permanent magnets 32 may be positioned in different horizontal positions, in the direction of movement (y-direction) with respect to the lower permanent magnets 31. The length of the lower permanent magnets 32 in the direction of movement y is larger than the length of the upper permanent magnet in the direction of movement y such that the magnetic gravity compensators 35 of the example shown in FIG. 7A exerts a lifting force on the balance mass 183 substantially independent of the horizontal position of the balance mass 183 with respect to the position of the reference 10 within the range of movement of the balance mass 183. The lifting force provided by the magnetic gravity compensators 35 may for example be regarded to be substantially independent of the position in y-direction of the balance mass 183 with respect to the reference 10 when the lifting force has a maximum deviation of 20 percent, for instance a maximum deviation of 10 percent, within the range of movement of the balance mass 183.

In some embodiments, there may be some displacement of the balance mass 183 in the horizontal direction perpendicular to the direction of movement, in the current example in the x-direction. In such case, the magnetic gravity compensators 35 of the example shown in FIG. 7A may also be designed to exert a lifting force on the balance mass 183 substantially independent of the horizontal position of the balance mass 183 with respect to the position of the reference 10 in this horizontal direction perpendicular to the direction of movement (in the x-direction) within the range of movement in this direction. The lifting force provided by the magnetic gravity compensators 35 may for example be regarded to be substantially independent of the position in x-direction of the balance mass 183 with respect to the reference 10, when the lifting force has a maximum deviation of 20 percent, for instance a maximum deviation of 10 percent, within the range of movement of the balance mass 183 in the x-direction.

The positioning device 180 of FIG. 7A may, for example, be arranged in a vacuum environment 40, for example a vacuum chamber, in which there is a relatively low pressure, since the effect of magnetic gravity compensators 35 is based on magnetic forces.

The magnetic gravity compensators 35 of FIG. 7A are designed to exert a repelling force on the balance mass 183 that pushes the balance mass 183 upwards. In some other embodiments, one or more magnetic gravity compensators may be provided to exert an attracting force on the balance mass to pull the balance mass upwards. In such embodiments, the magnetic gravity compensators 35 may, for example, replace the hinges 22, 23 and springs 21 as shown in FIG. 5.

FIG. 8 discloses another example of a positioning device 180 according to some embodiments of the present disclosure. The positioning device comprises a stage 181, actuators 182, a balance mass 183 which is supported by leaf springs 184 on a reference 10. As explained with respect to the positioning device of FIG. 4, the weight of the balance mass 183 requires the leaf springs 184 to have a minimal stiffness in the vertical direction in order to exert a lifting force on the balance mass 183 to counteract the gravity force exerted on the balance mass 183. The weight ratio between the weight of the balance mass 183 and the weight of the stage 181, and the desired displacement of the stage 181, determines a maximal displacement that the leaf springs 184 may allow between the balance mass 183 and the reference 10. The design of the leaf springs 184 is optimized to have a minimal stiffness in vertical and horizontal directions. As explained above, the leaf springs 184 may still require some stiffness in the horizontal direction of movement (y-direction) of the balance mass 183 in order to provide a stable support for the balance mass 183. This stiffness of the leaf springs 184 in the horizontal direction of movement (y-direction) may normally result, when the balance mass 183 is moved out of a central position, in a force that pushes the balance mass 183 back to the central position of the balance mass 183.

In the example shown in FIG. 8, a stiffness reduction device 60 is provided, which acts between the reference 10 and the balance mass 183 to provide a negative stiffness in the horizontal direction to counteract the horizontal stiffness of the leaf springs 184.

The stiffness reduction device 60 comprises a permanent magnet 61 mounted on the reference 10 and a plate 62 of magnetic or magnetizable material mounted with plate supports 63 on the balance mass 183. In some other embodiments, the permanent magnet may be mounted on the reference 10 and the plate of magnetic or magnetizable material may be mounted, for example with plate supports, on the balance mass 183.

FIG. 9 shows a top view A-A on a cross section of the permanent magnet 61 and the plate 62 of the stiffness reduction device 60. The plate 62 which is a plate shaped body made of magnetic or magnetizable material, such as ferromagnetic material, comprises an opening 64 in which the permanent magnet 61 is arranged. The permanent magnet 61 may move within the opening 64 in the direction of movement (y-direction) and in the horizontal direction perpendicular to the direction of movement (x-direction). The range of movement of the permanent magnet 61 within the opening 64 corresponds with the movements made by the balance mass 183 as a result of movements of the stage 181, when actuated by the actuators 182.

In FIGS. 8 and 9, the balance mass 183 is in a central position of its range of movement, in which the permanent magnet 61 is also arranged in a central position of the opening 64. The opening 64 is designed and positioned such that in this central position of the permanent magnet 61 within the opening 64, the magnetic forces between the permanent magnet 61 and the plate 62 may be substantially equal in the positive and negative direction of the direction of movement y. In other words, the magnetic forces acting between the permanent magnet 61 and the plate 62 compensate each other.

FIG. 10 shows the permanent magnet 61 after it is moved out of the central position within the opening 64 of the plate 62 (e.g. in the positive y-direction, as shown in FIG. 10). This movement results from a movement of the balance mass 183 out of its central position. In this non-central position of the permanent magnet 61 with respect to the opening 64, the magnetic forces between the permanent magnet 61 and the plate 62 may no longer compensate each other. For example, at one side of the permanent magnet 61 (e.g. the right side in FIG. 10) a distance between the permanent magnet 61 and the plate 62 is decreased resulting in an increase of the attracting magnetic forces between the permanent magnet 61 and the plate 62, while at the opposite side of the permanent magnet 61 (e.g. the left side in FIG. 10) a distance between the permanent magnet 61 and the plate 62 is increased resulting in an decrease of the attracting magnetic forces between the permanent magnet 61 and the plate 62. As a result, of this misbalance of the attracting magnetic forces between the permanent magnet 61 and the plate 62 in the position shown in FIG. 10, the permanent magnet 61 may effectively be pulled by the magnetic forces between the permanent magnet 61 and the plate 62 in the positive y-direction (to the right in FIG. 10). This pulling force on the permanent magnet 61 functions as a negative stiffness that may be used to counteract the horizontal stiffness in y-direction in the leaf springs 184 that may push the balance mass 183 in the opposite negative direction of the direction of movement y (to the left in FIG. 10) back to the central position of the permanent magnet 61 in the opening 64.

In the current example, negative stiffness provided by the stiffness reduction device 60 is configured to counteract the stiffness of the leaf springs 184. The negative stiffness is not necessarily created by stiffness of a material.

The stiffness of the leaf springs 184 and the negative stiffness provided by the stiffness reduction device 60 provide a combined stiffness of the support of the balance mass 183. This combined stiffness is a lower stiffness than the horizontal stiffness of the leaf springs 184. As a result, the disturbance effect of the horizontal stiffness of the leaf springs 184 may be substantially reduced.

FIG. 11 shows a first stiffness profile SLS of the leaf springs 184, a second stiffness profile SRD of the stiffness reduction device 60 and a combined stiffness profile CSP combining the stiffness of the first stiffness profile SLS and the second stiffness profile SRD. The stiffness profiles show the relationship between position $P_y$ of the balance mass 183 in the direction of movement y with respect to the central position ($P_y$=0) and the resulting force $F_y$ acting on the balance mass 183 in the direction of movement y. It should be clear to the person skilled in the art that the resulting force $F_y$ is a pulling force when $F_y$ has a positive value in this context, especially in view of previous paragraphs. In some embodiments, the combined stiffness profile CSP provides a small positive stiffness such that the combination of positive stiffness of the leaf springs 184 and negative stiffness of the stiffness reduction device 60 results in a stable system.

The first stiffness profile SLS of the leaf springs 184 and the second stiffness profile SRI) of the stiffness reduction device 60 are linear stiffness profiles. It will be clear that the second stiffness profile SRI) of the stiffness reduction device 60 is adapted to the first stiffness profile SLS of the leaf springs 184 in order to obtain a predetermined combined stiffness profile CSP. The second stiffness profile SRI) of the stiffness reduction device 60 may be designed to be linear or non-linear in order to obtain the desired combined stiffness profile CSP. The second stiffness profile SRD of the stiffness reduction device 60 is determined by the shape and size of the opening 64 of the plate 62, the shape and size of the permanent magnet 61 and the magnetization of the permanent magnet 61.

For example, the first stiffness profile SLS may be a non-linear stiffness profile, for instance a stiffness profile having a progressively increasing stiffness from the central position of the balance mass 183. The second stiffness profile SRD may provide a corresponding non-linear stiffness profile in opposite direction to obtain a linear combined stiffness profile CSP. In some other embodiments, the combined stiffness profile CSP may be a non-linear stiffness profile.

To counteract the positive stiffness of the leaf springs 184 in the x-direction, i.e. the horizontal direction perpendicular to the (main) direction of movement y, the stiffness reduction device 60 may also be configured to provide a negative stiffness in the x-direction. When the balance mass 183 is in a central position of its range of movement in x-direction, as shown in FIGS. 8 and 9, the permanent magnet 61 may also be in a central position of the opening 64 in x-direction. The opening 64 may be designed and positioned such that in this central position of the permanent magnet 61 within the opening 64, the magnetic attraction forces in the positive and negative direction of the x-direction between the permanent magnet 61 and the plate 62 will be the same or at least substantially similar. In other words, the magnetic forces acting in the x-direction between the permanent magnet 61 and the plate 62 compensate each other when the permanent magnet 61 is positioned, seen in x-direction, in the central position in the opening 64.

When the permanent magnet 61 in the opening 64 is moved out of the central position in the x-direction, this may result in a misbalance between the magnetic forces acting between the permanent magnet 61 and the plate 62 that may effectively pull the permanent magnet 61 away from the central position. Thus, when the permanent magnet 61 is moved from the central position shown in FIG. 9 in the positive x-direction (to the top of FIG. 10), the magnetic forces acting between the permanent magnet 61 and the plate 62 may together exert a pulling force on the permanent magnet 61 in the positive x-direction. This pulling force on the permanent magnet 61 functions as a negative stiffness that counteracts the horizontal stiffness in x-direction in the leaf springs 184 that may push the balance mass 183 in the opposite direction of the x-direction (to bottom side of FIG. 10) back to the central position of the permanent magnet 61 in the opening 64. Thus, also in the x-direction, a negative stiffness may be provided by the stiffness reduction device 60.

The shape of the permanent magnet 61 and its magnetization, and the shape of the plate 62 and the opening 64 therein are selected to provide the desired profile of negative stiffness. In some embodiments, this desired profile of negative stiffness may be adapted to a parasitic movement of the balance mass 183, such that the horizontal stiffness in x-direction resulting from the parasitic movement is at least partially compensated by the stiffness reduction device 60.

In the design of the stiffness reduction device 60, the range of movement allowed by the stiffness reduction device 60, i.e. range of movement of the permanent magnet 61 in the opening 64, may be adapted to the desired range of movement of the balance mass 183 in one or both horizontal directions.

In the example shown in FIG. 8, the positioning device 180 is arranged in a vacuum environment 40, for example a vacuum chamber, in which there is a relatively low pressure. Since the effect of stiffness reduction device 60 is based on magnetic forces, the stiffness reduction device 60 may effectively be applied in the vacuum environment 40. Furthermore, the example of the stiffness reduction device 60 may further comprise magnetic shields (not shown, but similar as magnetic shields 37 of FIG. 7A) for shielding or reducing the magnetic field(s) of the stiffness reduction device 60 from its surroundings.

In FIG. 8, a balance mass actuator 70 is shown. Such balance mass actuator 70 may be provided to keep, when desired, the balance mass 183 in a position within the range of movement, in particular to prevent that the balance mass 183 returns to the central position of the balance mass 183 as a result of the horizontal stiffness of the leaf springs 184. In some embodiments, the balance mass actuator 70 may be designed to also act as a stiffness reduction device, wherein the balance mass actuator is arranged to actively provide an actuation force counteracting a static disturbance force resulting from the stiffness of the leaf springs 184 in the direction of movement.

FIG. 12 shows an example of a positioning device 180 according to some embodiments of the present disclosure, in which the upper permanent magnets 32 of a magnet assembly 30 of a magnetic gravity compensator 35 are also used as permanent magnets of a stiffness reduction device to reduce the horizontal stiffness of a balance mass 183 in the direction of movement y. The magnet assembly 30 corresponds to the magnet assembly shown in FIG. 6.

FIG. 13 shows a cross section B-B of the positioning device 180 at the height of the upper permanent magnets 32 of the magnet assembly 30.

The lower permanent magnets 31 of the magnet assembly 30 are mounted on the reference 10 and the upper permanent magnets 32 are mounted on the balance mass 183. The magnet assembly 30 is arranged below a magnetic shield 37. The lower permanent magnets 31 may exert a lifting force on the upper permanent magnets 32, and therewith on the balance mass 183, resulting, in use, in a reduction of the gravitational force exerted by the balance mass 183 in vertical direction on the leaf springs 184. Since a substantial part of the weight of the balance mass of 183 may be supported by the magnetic gravity compensator formed by the magnet assembly 30, the leaf springs 184 may be designed with a substantially reduced vertical stiffness. As a result, the horizontal stiffness of the leaf springs 184 in the direction of movement y of the balance mass 183 may also be reduced. This may effectively reduce the disturbance forces resulting from the horizontal stiffness of the leaf springs 184. Also, the actuation force to be provided by the actuator 70 to counteract the disturbance forces may be lower, resulting in less heat dissipation in the actuator 70.

To further reduce the effect of horizontal stiffness of the leaf springs 184, the upper permanent magnets 32 may be arranged in an opening 64 of a plate 62 which plate 62 is mounted on the reference 10 with plate supports 63. The upper permanent magnets 32 and the plate 62 act as a stiffness reduction device. The opening 64 of the plate 62 is designed such that in a central position of the upper permanent magnets 32 (attached to the balance mass 183), as shown in FIGS. 12 and 13, no effective magnetic force is exerted between the permanent magnets 32 and the plate 62. In other words, the magnetic forces acting between the upper permanent magnets 32 and the plate 62 compensate each other.

If the upper permanent magnets 32 in the opening 64 are moved out of the central position, for example in the positive y-direction, the upper permanent magnets 32 may be closer to one edge of the opening 64 and further away from an opposite edge of the opening 64. This results in a misbalance between the magnetic forces acting between one side of the upper permanent magnets 32 and the edge of the plate 62 and the magnetic forces acting between the opposite side of the upper permanent magnets 32 and the edge of the plate 62 at the opposite side of the opening 64 of the plate 62. This misbalance may result in that the upper permanent magnets 32 may effectively be pulled by the magnetic forces acting between the permanent magnets 32 and the plate 62 away from the central position, e.g. in the positive y-direction towards the closest edge of the opening 64. This pulling force on the upper permanent magnets 32 functions as a negative stiffness that at least partially counteracts the horizontal stiffness in y-direction in the leaf springs 184 that may push the balance mass 183 in the opposite direction of the direction of movement (to the left in FIG. 13) back to the central position of the balance mass 183.

Corresponding to the example shown in FIG. 8, the stiffness profile resulting from the stiffness reduction device formed by the permanent magnets 32 of the magnet assembly 30 and plate 62, in particular opening 64 in plate 62, may be adapted with respect to the stiffness profile of the leaf springs 184 in order to create a desired combined stiffness profile of the balance mass 183.

Figure 14:
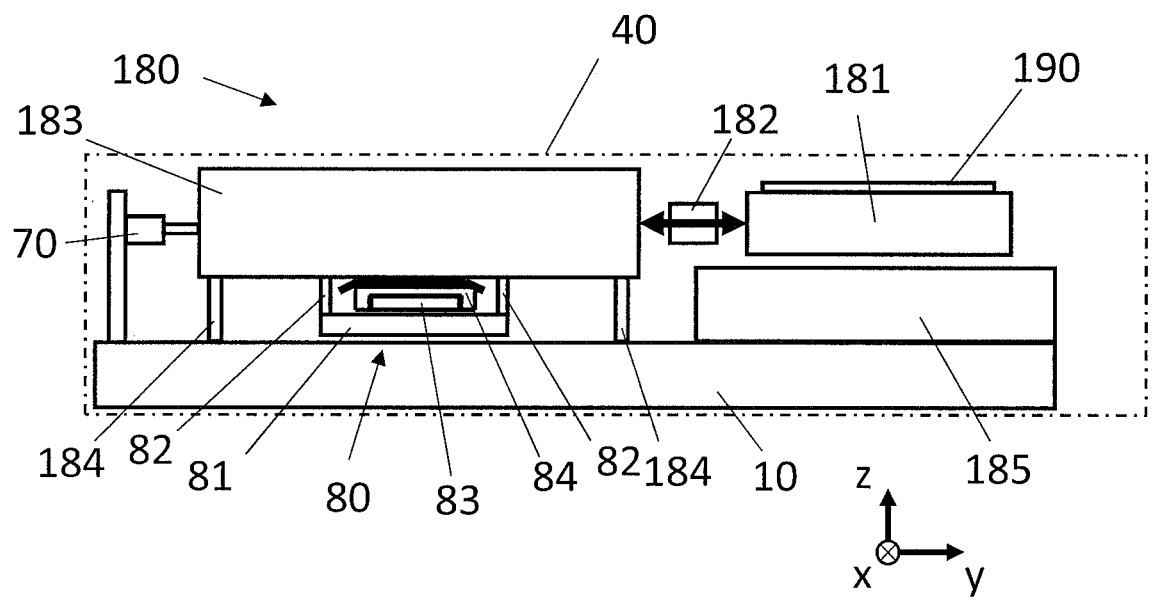
FIG. 14 schematically depicts a fifth example of a positioning device according to some embodiments of the present disclosure.

FIG. 14 schematically depicts a fifth example of a positioning device 180 according to some embodiments of the present disclosure. The positioning device 180 comprises one magnetic gravity compensator 80. In practice, multiple magnetic gravity compensators may be provided. The magnetic gravity compensator 80 comprises a first element 81 of magnetizable material mounted to the balance mass 183 with supports 82. The magnetic gravity compensator 80 further comprises a permanent magnet 83 arranged in a second element 84 of magnetizable material both mounted on the reference 10 (e.g. through a hole in first element 81 or by other means, supports not shown). The first element 81 and the second element 84 are provided to guide the magnetic field provided by the permanent magnet 83.

The magnetic gravity compensator 80 is constructed such that the magnet 83 exerts an attracting force on the first element 81. This attracting force of the magnetic gravity compensator 80 pulls the balance mass 183 upwards. This has the advantage, as described above with respect to other embodiments of the gravity compensators that the forces to be supported by the leaf springs 184 may be substantially reduced. As a result, the leaf springs 184 may be designed with less horizontal stiffness, leading to lower disturbance forces in the direction of movement y, and less heat dissipation in the balance mass actuator 70.

In the current example, the magnetic gravity compensator 80 is constructed to allow movement of the balance mass 183 in the direction of movement y and, when needed, in the x-direction, while maintaining substantially the same attracting magnetic force between the first element 81 and the combination of the permanent magnet 83 and the second element 84.

Further, the magnetic gravity compensator 80 is configured to provide an attracting magnetic force between the first element 81 and the permanent magnet 83 which is larger than the gravity force exerted on the balance mass 183. This has the advantage that the gravity force is completely compensated by the attracting magnetic force between the first element 81 and the permanent magnet 83 with the result that, when the leaf springs 184 fail, for example due to fatigue, the balance mass 183 may be lifted by the magnetic gravity compensator 80. Since the gap between the first element 81 and the magnet 83 is relatively small, failure of the leaf springs 183 may therefore only result in a small upwards movement of the balance mass 184, closing the gap between the first element 81 and the magnet 83 instead of the balance mass 184 falling down on the reference 10. This example of the magnetic gravity compensator 80 may prevent damage to parts of the positioning device 180, such as the actuator 182, the balance mass actuator 70, or magnetic shields.

Figure 15:
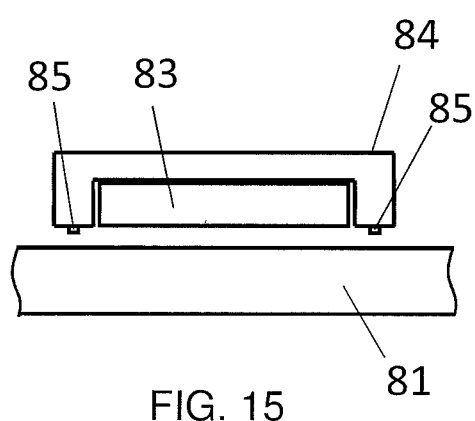
FIG. 15 schematically depicts a detail of an example of the magnetic gravity compensator of FIG. 14.

FIG. 15 shows a detail of the positioning device of FIG. 14 comprising the first element 81, the permanent magnet 83 and the second element 84. A rim 85 is provided on the surface of the second element 84 facing towards the first element 81. The rim 85 prevents that the first element 83 may move against the permanent magnet 83 in case of failure of the leaf springs 184. The rim therewith may prevent damage to the permanent magnet 83. As an alternative, other protrusions, such as bulbs, may be provided on the surface of the second element 84 facing towards the first element 81 to protect the magnet 83.

Figure 16:
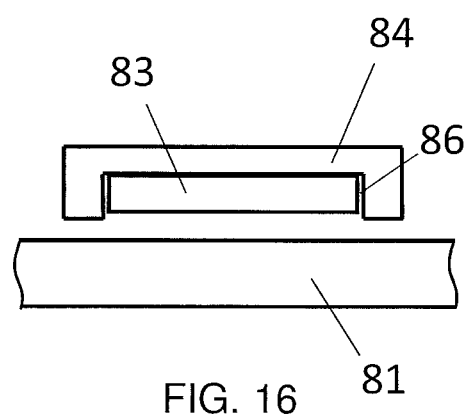
FIG. 16 schematically depicts a detail of an alternative example of the magnetic gravity compensator of FIG. 14.

FIG. 16 shows an alternative example of the first element 81, the permanent magnet 83 and the second element 84, in which the permanent magnet 83 is protected against damage that may be caused by the first element 81 moving upwards in case of failure of the leaf springs 184. In this example, the second element 84 comprises a recess 86 in which the permanent magnet 83 is placed, wherein the depth of the recess 86 is larger than a height of the permanent magnet 83 in the same direction. As a result, the permanent magnet 83 is completely arranged in the recess 86. When the first element 81 would move upwards after failure of the leaf springs 184, the surface of the second element 84 surrounding the recess 86 and facing towards the first element 81 may prevent that the first element 81 will come into contact with the permanent magnet 83.

In the example of FIG. 14, the first element 81 is mounted on the balance mass 183 and the permanent magnet 83 and the second element 84 are mounted on the reference 10. In an alternative example, the first element 81 may be mounted on the reference 10 and the permanent magnet 83 and the second element 84 may be mounted on the balance mass 183. Furthermore, the first element 81 and the permanent magnet 83 may also be designed to provide a repelling force between the first element 81 and the permanent magnet 83 which repelling force is used to exert a lifting force on the balance mass 183.

Hereinabove, different examples of a positioning device are described, wherein a disturbance effect of the stiffness of the leaf springs supporting the balance mass in a direction of movement of the balance mass is at least partially compensated by a gravity compensator and/or a stiffness reduction device. Such positioning device may be applied in any e-beam apparatus, such as an e-beam inspection apparatus, an e-beam lithography apparatus, or any other apparatus using an e-beam.

In the above embodiments, the balance mass 183 was intended to move in one horizontal direction to follow movements of the stage 181. In some other embodiments, the balance mass 183 may move in two perpendicular horizontal directions. The gravity compensator and/or the stiffness reduction device may be designed to allow movements in the range of movement of the balance mass in both horizontal directions.

The gravity compensators and/or the stiffness reduction devices described hereinabove use permanent magnets. In some other embodiments, the magnets may also be electromagnets that can be magnetized by electric energy.

Furthermore, in some of the above described embodiments, permanent magnets are mounted on the reference, while counter elements that magnetically cooperate with the magnets are mounted on the balance mass. In some other embodiments, the magnets may be mounted on the balance mass while the counter elements may be mounted on the reference.

The gravity compensator and/or the stiffness reduction device may also be applied in a positioning device of an e-beam apparatus to reduce the disturbance effect of another support device supporting the balance mass having a stiffness in the horizontal direction of movement of the balance mass.

Embodiments of the present disclosure may further be described using the following clauses:

1. A positioning device configured to displace an object, comprising:
   a stage to support the object,
   an actuator to move the stage with respect to a reference in a direction of movement,
   a balance mass arranged between the actuator and the reference to reduce transfer of reaction forces from the actuator to the reference,
   a support device arranged between the reference and the balance mass to support the balance mass, and
   a gravity compensator acting between the reference and the balance mass to exert a lifting force on the balance mass to reduce a gravitational support force to be provided by the support device to support the balance mass.

2. The positioning device of clause 1, wherein the gravity compensator is a magnetic gravity compensator.

3. The positioning device of clause 2, wherein the positioning device comprises a magnetic shield to shield magnetic fields of the magnetic gravity compensator.

4. The positioning device of clause 1, wherein the gravity compensator is a mechanical gravity compensator.

5. The positioning device of any of the preceding clauses, wherein the gravity compensator is arranged to exert an attracting force on the balance mass or wherein the gravity compensator is arranged to exert a repelling force on the balance mass.

6. The positioning device of any of the clauses 1-5, wherein a stiffness of the gravity compensator in the direction of movement is substantially smaller than a stiffness of the support device in the direction of movement.

7. The positioning device of any of the clauses 1-6, wherein the gravity compensator provides a lifting force that is 0.8-1.2 times the gravity force exerted on the balance mass.

8. The positioning device of any of the clauses 1-6, wherein the positioning device comprises multiple gravity compensators, wherein the multiple gravity compensators together provide a lifting force that is 0.8-1.2 times the gravity force exerted on the balance mass.

9. The positioning device of any of the preceding clauses, wherein the support device comprises one or more elastic guiding devices.

10. The positioning device of clause 9, wherein the one or more elastic guiding devices are one or more leaf springs, wherein the one or more leaf springs allow a maximum displacement from a central position of the balance mass in the direction of movement and wherein the one or more leaf springs each has an effective spring length, wherein the maximum displacement is at least 0.15 times the effective spring length.

11. The positioning device of any of the preceding clauses, wherein a maximum lifting force to be provided by the support device is less than 0.5 times a gravity force exerted on the balance mass.

12. The positioning device of any of the preceding clauses, wherein the gravity compensator is arranged to exert the lifting force on the balance mass in a range of movement of the balance mass with respect to the reference in the direction of movement.

13. The positioning device of clause 12, wherein the gravity compensator is further arranged to exert the lifting force on the balance mass in a range of movement of the balance mass with respect to the reference in a horizontal direction perpendicular to the direction of movement.

14. The positioning device of any of the preceding clauses, wherein the direction of movement is a horizontal direction.

15. The positioning device of any of the preceding clauses, wherein the gravity compensator is arranged to provide a negative stiffness in the direction of movement that counteracts at least partly a positive stiffness of the support device in the direction of movement.

16. The positioning device of clause 15, wherein the gravity compensator is arranged to provide the negative stiffness in dependence of the position of the balance mass with respect to the reference in the direction of movement.

17. The positioning device of clause 15 or 16, wherein the positive stiffness and the negative stiffness result in a combined stiffness between the reference and the balance mass in the direction of movement, wherein the gravity compensator is designed to provide a predetermined combined stiffness profile along the direction of movement.

18. A positioning device configured to displace an object, comprising:
a stage to support the object,
an actuator to move the stage with respect to a reference in a direction of movement,
a balance mass arranged between the actuator and the reference to reduce transfer of reaction forces from the actuator to the reference,
a support device arranged between the reference and the balance mass, the support device having a first stiffness in the direction of movement, and
a stiffness reduction device acting between the reference and the balance mass, the stiffness reduction device providing a second stiffness in the direction of movement, wherein the second stiffness is a negative stiffness that counteracts the first stiffness at least partly.

19. The positioning device of clause 18, wherein the stiffness reduction device is arranged to provide a second stiffness in dependence of the position of the balance mass with respect to the reference in the direction of movement.

20. The positioning device of clause 19, wherein the second stiffness of the stiffness reduction device is linearly dependent on the position of the balance mass with respect to the reference in the direction of movement.

21. The positioning device of clause 19, wherein the second stiffness of the stiffness reduction device is non-linearly dependent on the position of the balance mass with respect to the reference in the direction of movement.

22. The positioning device of any of the clauses 19-21, wherein the first stiffness and the second stiffness result in a combined stiffness between the reference and the balance mass in the first direction of movement, wherein the stiffness reduction device is designed to provide a predetermined combined stiffness profile along the direction of movement.

23. The positioning device of clause 22, wherein the predetermined combined stiffness profile is a linear profile.

24. The positioning device of clause 22 wherein the predetermined combined stiffness profile is a non-linear profile.

25. The positioning device of any of the clauses 22-24, wherein the stiffness reduction device is arranged to provide the combined stiffness profile, wherein the combined stiffness, at a position of the balance mass with respect to the reference, is a positive stiffness of less than 0.2 times the first stiffness.

26. The positioning device of any of the clauses 18-25, wherein the stiffness reduction device is configured to provide, when the balance mass is in a central position with respect to the reference, a second stiffness substantially equal to zero.

27. The positioning device of clause 24 or 26, wherein the predetermined combined stiffness profile has a progressively increasing combined stiffness increasing from the central position of the balance mass in the direction of movement.

28. The positioning device of any of the clauses 18-27, wherein the stiffness reduction device comprises one or more magnets mounted on one of the reference and the balance mass, and acting in the direction of movement on a magnetic or magnetizable structure mounted on the other of the reference and the balance mass.

29. The positioning device of any of the clauses 18-28, wherein the stiffness reduction device comprises a magnetic or magnetizable structure having an opening and one or more magnets arranged in the opening, wherein dimensions of the opening and/or the one or more magnets are selected to provide a predetermined second stiffness in dependence of the position of the one or more magnets with respect to the opening in the direction of movement.

30. The positioning device of clause 28 or 29, wherein the one or more magnets are permanent magnets or electromagnets.

31. The positioning device of any of the clauses 18-30, wherein a balance mass actuator is arranged to actively provide an actuation force at least partially counteracting a disturbance force resulting from the stiffness of the support device in the direction of movement.

32. The positioning device of any of the clause 18-31, wherein the support device comprises one or more elastic guiding devices arranged between the balance mass and the reference.

33. The positioning device of any of the clause 1-32, comprising a magnetic shield arranged to substantially enclose the balance mass and at least part of the magnetic gravity compensator to shield magnetic fields of the magnetic gravity compensator, wherein the magnetic shield comprises an opening to allow the balance mass to move in response to the reaction force.

34. The positioning device of clause 33, wherein a material of the magnetic shield is chosen based on a relative permeability of the material at a magnetic flux density level within the magnetic shield to achieve efficient shielding of the magnetic fields.

35. The positioning device of clause 33 or 34, wherein at least part of the actuator and/or the balance mass actuator, which produces magnetic fields during an operation of the actuator and/or the balance mass actuator, is arranged in, on, around, or in connection to the balance mass, and wherein the magnetic shield substantially encloses the at least part of the actuator and/or the balance mass actuator.

36. The positioning device of any of clauses 33 to 35, wherein the magnetic shield comprises a first magnetic shield and a second magnetic shield, wherein the first magnetic shield substantially encloses one or more of the balance mass, the magnetic gravity compensator, and the at least part of the actuator and/or the balance mass actuator, and wherein the second magnetic shield substantially encloses the first magnetic shield.

37. The positioning device of clause 36, wherein the magnetic shield comprising a space between the first magnetic shield and the second magnetic shield or one or more of non-ferromagnetic material, a material with a relative permeability permeability smaller than the first and second magnetic shields, and a material with a relative permeability close to or substantially equal to 1 between the first magnetic shield and the second magnetic shield.

38. The positioning device of clause 36 or 37, wherein a first material of the first magnetic shield is chosen based on a first relative permeability of the first material at a first magnetic flux density level within the first magnetic shield, and a second material of the second magnetic shield, being different material from the first material, is chosen based on a second relative permeability of the second material at a second magnetic flux density level within the second magnetic shield to achieve efficient shielding of the magnetic fields.

39. A stiffness reduction device to reduce a first stiffness of a support device arranged between a reference and a balance mass to allow movement between the balance mass and the reference in a direction of movement, wherein the stiffness reduction device provides a second stiffness in the direction of movement, wherein the second stiffness is a negative stiffness that counteracts the first stiffness at least partly.

40. The stiffness reduction device according to clause 39, wherein the stiffness reduction device comprises one or more magnets mounted on one of the reference and the balance mass, and acting in the direction of movement on a magnetic or magnetizable structure mounted on the other of the reference and the balance mass.

41. The stiffness reduction device according to any of the clauses 39 to 40, wherein the stiffness reduction device is arranged to provide a second stiffness in dependence of the position of the balance mass with respect to the reference in the direction of movement.

42. The stiffness reduction device according to any of the clauses 39 to 41, wherein the first stiffness and the second stiffness result in a combined stiffness between the reference and the balance mass in the first direction of movement, wherein the stiffness reduction device is arranged to provide a predetermined combined stiffness profile along the direction of movement.

43. An E-beam apparatus, comprising:
the positioning device according to any of the clauses 1-38, wherein the positioning device is configured to displace the object relative to the e-beam generated by the electron optics system. 44. The e-beam apparatus of clause 43, wherein the e-beam apparatus is an e-beam inspection apparatus, e-beam lithography apparatus, or any other apparatus using an e-beam.

45. An apparatus with a vacuum chamber, comprising the positioning device according to any of the clauses 1-38, wherein the positioning device is arranged in the vacuum chamber.

46. An apparatus comprising the positioning device according to any of the clauses 1-38, wherein the apparatus is a lithographic apparatus.

Although the present disclosure has been explained in relation to its preferred embodiments, it is to be understood that other modifications and variation can be made without departing the spirit and scope of the invention as hereafter claimed. Possible other applications include a lithographic apparatus for transferring (e.g. by exposure processes) a pattern on to semiconductor wafers comprising the positioning devices of the present disclosure.

What is claimed is:

1. A positioning device configured to displace an object, comprising:
   a stage to support the object,
   an actuator to move the stage with respect to a reference in a direction of movement,
   a balance mass arranged between the actuator and the reference to reduce transfer of reaction forces from the actuator to the reference,
   a support device arranged between the reference and the balance mass to support the balance mass, and
   a gravity compensator acting between the reference and the balance mass to exert a lifting force on the balance mass to reduce a gravitational support force to be provided by the support device to support the balance mass,
   wherein the gravity compensator is arranged to exert an attracting force on the balance mass or wherein the gravity compensator is arranged to exert a repelling force on the balance mass.

2. The positioning device of claim 1, wherein the gravity compensator is a magnetic gravity compensator and/or a mechanical gravity compensator.

3. The positioning device of claim 2, wherein the positioning device comprises a magnetic shield to shield magnetic fields of the magnetic gravity compensator.

4. The positioning device of claim 1, wherein a stiffness of the gravity compensator in the direction of movement is substantially smaller than a stiffness of the support device in the direction of movement.

5. The positioning device of claim 1, wherein the gravity compensator provides a lifting force that is in a range between 0.8 and 1.2 times the gravity force exerted on the balance mass.

6. The positioning device of claim 1, wherein the positioning device comprises multiple gravity compensators, wherein the multiple gravity compensators together provide a lifting force that is in the range between 0.8 and 1.2 times the gravity force exerted on the balance mass.

7. The positioning device of claim 1, wherein the support device comprises one or more elastic guiding devices.

8. The positioning device of claim 7, wherein the one or more elastic guiding devices are one or more leaf springs, wherein the one or more leaf springs allow a maximum displacement from a central position of the balance mass in the direction of movement, and wherein the one or more leaf springs each has an effective spring length, wherein the maximum displacement is at least 0.15 times the effective spring length.

9. The positioning device of claim 1, wherein a maximum lifting force as provided by the support device is less than 0.5 times a gravity force exerted on the balance mass.

10. The positioning device of claim 1, wherein the gravity compensator is arranged to exert the lifting force on the balance mass in a range of movement of the balance mass with respect to the reference in the direction of movement.

11. The positioning device of claim 1, wherein the gravity compensator is arranged to provide a stiffness that counteracts at least partly a stiffness of the support device in the direction of movement.

12. An E-beam apparatus, comprising:
the positioning device of claim 1, wherein the positioning device is configured to displace the object relative to the e-beam generated by the electron optics system, wherein the e-beam apparatus is an e-beam inspection apparatus, e-beam lithography apparatus, or any other apparatus using an e-beam.

13. An apparatus with a vacuum chamber, comprising:
the positioning device of claim 1, wherein the positioning device is arranged in the vacuum chamber.

14. An apparatus comprising the positioning device of claim 1,
wherein the apparatus is a lithographic apparatus.

15. The positioning device of claim 1, wherein the gravity compensator comprises a magnetic gravity compensator and the position device further comprises:
a magnetic shield arranged to substantially enclose the balance mass and at least part of the magnetic gravity compensator to shield magnetic fields of the magnetic gravity compensator,
wherein the magnetic shield comprises an opening to allow the balance mass to move in response to the reaction force.

16. The positioning device of claim 15, wherein a material of the magnetic shield has a relative permeability at a magnetic flux density level within the magnetic shield to achieve a target shielding level of the magnetic fields.

17. The positioning device of claim 15, wherein the magnetic shield comprises a first magnetic shield and a second magnetic shield, wherein the first magnetic shield substantially encloses one or more of the balance mass, the magnetic gravity compensator, and the at least part of the actuator and/or the balance mass actuator, and wherein the second magnetic shield substantially encloses the first magnetic shield.

18. The positioning device of claim 17, wherein the magnetic shield comprising a space between the first magnetic shield and the second magnetic shield or one or more of non-ferromagnetic material, a material with a relative permeability smaller than the first and second magnetic shields, and a material with a relative permeability close to or substantially equal to 1 between the first magnetic shield and the second magnetic shield.

19. The positioning device of claim 17, wherein a first material of the first magnetic shield is chosen based on a first relative permeability of the first material at a first magnetic flux density level within the first magnetic shield, and a second material of the second magnetic shield, being different material from the first material, is chosen based on a second relative permeability of the second material at a second magnetic flux density level within the second magnetic shield to achieve a target shielding level of the magnetic fields.

* * * * *